United States Patent
Hsu et al.

(10) Patent No.: US 7,532,522 B2
(45) Date of Patent: May 12, 2009

(54) MEMORY AND LOW OFFSET CLAMP BIAS CIRCUIT THEREOF

(75) Inventors: Jer-Hao Hsu, Hsinchu (TW); Chung-Kuang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 258 days.

(21) Appl. No.: 11/551,387

(22) Filed: Oct. 20, 2006

(65) Prior Publication Data

US 2008/0094920 A1    Apr. 24, 2008

(51) Int. Cl.
 *G11C 5/14*    (2006.01)
(52) U.S. Cl. ................... 365/189.09; 365/210.1
(58) Field of Classification Search ............ 365/189.09, 365/210, 207
See application file for complete search history.

(56) References Cited

U.S. PATENT DOCUMENTS

| | | | |
|---|---|---|---|
| 5,933,373 A * | 8/1999 | Takahashi | 365/189.06 |
| 6,072,742 A | 6/2000 | Ooishi | |
| 6,236,598 B1 * | 5/2001 | Chou | 365/189.06 |
| 6,897,703 B2 * | 5/2005 | Hunt | 327/313 |
| 7,251,163 B2 * | 7/2007 | O | 365/185.18 |

* cited by examiner

*Primary Examiner*—Anh Phung
(74) *Attorney, Agent, or Firm*—J.C. Patents

(57) ABSTRACT

A memory and a low offset clamp bias circuit thereof are provided. The low offset clamp bias circuit is adapted for any existing memory and is used for reducing the variation of a drain side voltage $V_d$ supplied to a memory cell in a memory cell array area through the feedback mechanism formed by a clamp bias modulator and a constant voltage generator. Thereby, the accuracy in reading, writing, or erasing data in the memory can be improved.

18 Claims, 3 Drawing Sheets

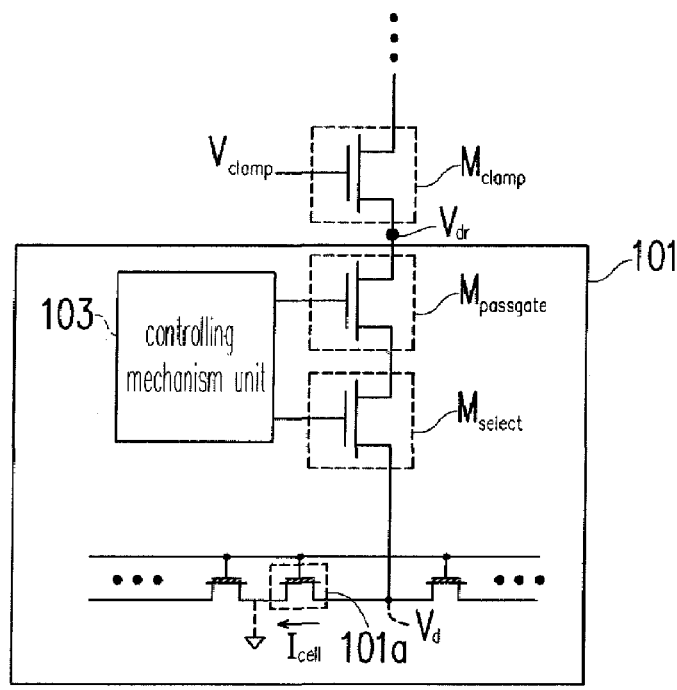
FIG. 1 (PRIOR ART)
|  | $V_{clamp}$ | $V_{dr}$ | $V_d$ |
|---|---|---|---|
| $I_{cell} = 5\mu A$ | 2.833V | 1.709V | 1.675V |
| $I_{cell} = 25\mu A$ | 2.833V | 1.607V | 1.441V |
| variation | 0V | 0.102V | 0.234V |
FIG. 2 (PRIOR ART)
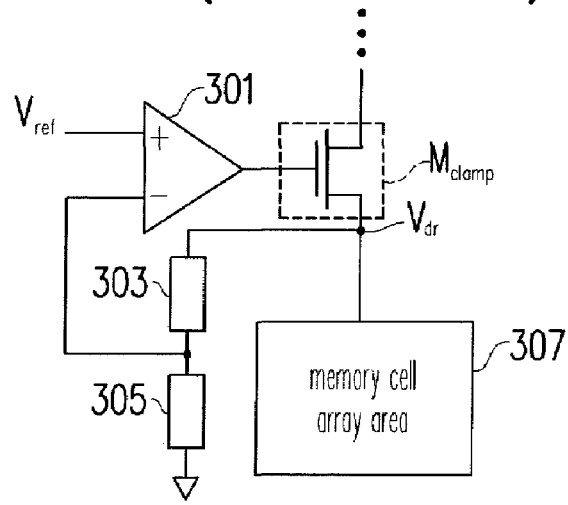
FIG. 3 (PRIOR ART)

|  | $V_{clamp}$ | $V_{dr}$ | $V_d$ |
|---|---|---|---|
| $I_{cell} = 5\mu A$ | 2.35V | 1.658V | 1.629V |
| $I_{cell} = 25\mu A$ | 2.46V | 1.639V | 1.493V |
| variation | 0.009V | 0.019V | 0.136V |

US 7,532,522 B2

MEMORY AND LOW OFFSET CLAMP BIAS CIRCUIT THEREOF

BACKGROUND OF THE INVENTION

1. Field of the Invention

The present invention relates to a low offset clamp bias circuit of a memory. More particularly, the present invention relates to a low offset clamp bias circuit applied to a memory which having multilevel memory cells.

2. Description of Related Art

At present, various kinds of memory, such as flash memory, dynamic random access memory (DRAM), and static random access memory (SRAM), the accuracy in reading, writing, or erasing data therein has become one of the major factors for manufacturers to develop memory products, and is the key for improving the competitiveness of a memory product.

It is known that the aforementioned memory has a plurality of memory cell array areas, and each memory cell array area has a plurality of memory cells, which may be multilevel memory cells. FIG. 1 is a diagram of a conventional clamp bias circuit applied to the drain side voltage $V_d$ of a memory cell, wherein the gate of a clamp transistor $M_{clamp}$ receives a clamp voltage $V_{clamp}$ and then the source side of the clamp transistor $M_{clamp}$ provides a voltage $V_{dr}$ to the memory cell array area 101. Wherein, in the memory cell array area 101, the transistors $M_{passgate}$ and $M_{select}$ are controlled by a controlling mechanism unit 103 to select the memory cell to be read, written, or erased. For example, when the memory cell 101a is to be read, the voltage $V_{dr}$ is provided to the drain side of the memory cell 101a so that the memory cell 101a produces a memory cell current $I_{cell}$.

Generally speaking, resistive loading effect may be produced between the transistors $M_{passgate}$ and $M_{select}$, and between the transistor $M_{select}$ and the memory cell 101a due to the inherent architecture of the memory, which make the memory cell current $I_{cell}$ produced by the memory cell 101a will reduce the read margin and further the data in the memory cell 101a are read incorrectly. FIG. 2 is a table illustrating the differences of the drain side voltage $V_d$ of the memory cell 101a in FIG. 1 when the memory cell 101a produces different memory cell currents $I_{cell}$. Referring to both FIG. 1 and FIG. 2, the table as shown in FIG. 2 is mainly for showing the variations of the drain side voltage $V_d$ of the memory cell 101a when the memory cell 101a produces different memory cell currents $I_{cell}$, for example, 5 uA or 25 uA, and with the aforementioned resistive loading effect in consideration.

It can be understood from the table in FIG. 2 that the clamp voltage $V_{clamp}$ received by the gate of the clamp transistor $M_{clamp}$ is 2.833V, and when the memory cell current $I_{cell}$ produced by the memory cell 101a is 5 uA or 25 uA, the voltage $V_{dr}$ provided by the source side of the clamp transistor $M_{clamp}$ is respectively 1.709V and 1.607V, thus the variation is 0.102V (102 mV). Next, when the resistive loading effect is considered and the memory cell current $I_{cell}$ produced by the memory cell 101a is 5 uA or 25 uA, the drain side voltage $V_d$ of the memory cell 101a is respectively 1.675V and 1.441V, thus the variation is 0.234V (234 mV). As described above, when the memory cell 101a produces different memory cell current $I_{cell}$ and the resistive loading effect is considered, the drain side voltage $V_d$ of the memory cell 101a changes about 234 mV, thus, the memory cell current $I_{cell}$ produced by the memory cell 101a will reduce the read margin, resulting in a data reading error to the memory cell 101a.

To improve the accuracy in reading, writing, or erasing memory data, conventionally the drain side voltage $V_d$ supplied to each memory cell is fixed so that the accuracy in no matter reading, writing, or erasing memory data can be improved.

FIG. 3 is a diagram illustrating a conventional clamp bias circuit for reducing the variation of the drain side voltage $V_d$ of a memory cell. Referring to FIG. 3, the voltage $V_{dr}$ provided by the source side of the transistor $M_{clamp}$ is clamped to be equal in $[(R_{303}+R_{305})/R_{305}]*Vref$ by adding an operation amplifier 301 and resistors 303 ($R_{303}$) and 305 ($R_{305}$), wherein the Vref is a reference voltage, so as to fix the drain side voltage supplied to each memory cell in the memory cell array area 307 (which is similar to the memory cell array area 101 in FIG. 1, therefore, the details will not be described herein), so that the memory cell current $I_{cell}$ produced by each memory cell in the memory cell array area 307 falls out of the read margin, accordingly, data in each memory cell in the memory cell array area 307 can be read accurately. However, even though the purpose of accurately reading the data in each memory cell in the memory cell array area 307 can be achieved by the clamp bias circuit in FIG. 3, which is used for reducing the drain side voltage variation of a memory cell, the fabricating cost and power consumption of the memory are increased, and the surface area taken by the memory at designing the chip is increased too.

SUMMARY OF THE INVENTION

Accordingly, the present invention is directed to provide a low offset clamp bias circuit, wherein a constant voltage generator and a clamp bias modulator are added to prevent the memory cell areas of a memory from being affected by resistive loading effect, accordingly, the variation of the drain side voltage supplied to each memory cell in the memory cell array area can be reduced and the read margin of the memory cell can be increased so that data in the memory cell can be read more accurately.

According to another aspect of the present invention, a memory is provided, wherein the foregoing low offset clamp bias circuit is adopted, thus the foregoing advantages of the low offset clamp bias circuit of the present invention can be achieved in the memory; meanwhile, the power consumption of the memory can be reduced, and moreover, the surface area taken by the memory at chip design is smaller, and accordingly the fabricating cost thereof can be reduced.

Based on the aforementioned and other objectives, the low offset clamp bias circuit in the present invention is adapted for a memory, wherein the memory has a plurality of memory cell array areas, and each memory cell array area has a plurality of memory cells. The low offset clamp bias circuit comprises a constant voltage generator and a clamp bias modulator. Wherein, the constant voltage generator is coupled to one of the memory cell array areas for outputting a constant voltage according to the current of one memory cell in the memory cell array area. The clamp bias modulator is coupled to the constant voltage generator for comparing a reference voltage and the foregoing constant voltage and outputting a clamp voltage to the constant voltage generator according to the comparison result.

According to another aspect of the present invention, a memory is provided. The memory comprises a plurality of memory cell array areas and a low offset clamp bias circuit. Each of the memory cell array areas has a plurality of memory cells, and the low offset clamp bias circuit comprises a constant voltage generator and a clamp bias modulator. Wherein, the constant voltage generator is coupled to one of the memory cell array areas for outputting a constant voltage according to the current of one memory cell. The clamp bias modulator is coupled to the constant voltage generator for comparing a reference voltage and the foregoing constant voltage and outputting a clamp voltage to the constant voltage generator according to the comparison result.

According to an exemplary embodiment of the present invention, when the constant voltage output by the constant voltage generator is higher than the reference voltage received by the clamp bias modulator, the clamp voltage output by the clamp bias modulator will decrease so that the constant voltage output by the constant voltage generator decreases to the reference voltage received by the clamp bias modulator; when the constant voltage output by the constant voltage generator is lower than the reference voltage received by the clamp bias modulator, the clamp voltage output by the clamp bias modulator will increase so that the constant voltage output by the constant voltage generator increases to the reference voltage received by the clamp bias modulator.

According to an exemplary embodiment of the present invention, the clamp bias modulator includes a first transistor, a second transistor, a third transistor, and a fourth transistor. Wherein, the gate of the first transistor (NMOS transistor) is used for receiving the reference voltage received by the clamp bias modulator, and the first source/drain of the first transistor is used for receiving a first voltage level (ground voltage level GND).

The first source/drain of the second transistor (PMOS transistor) is used for receiving a second voltage level (system voltage VDD), and the gate and the second source/drain of the second transistor are coupled together and to the second source/drain of the first transistor. The first source/drain of the third transistor (PMOS transistor) is used for receiving the second voltage level, and the gate of the third transistor is coupled to the gate of the second transistor. The first source/drain of the fourth transistor (NMOS transistor) is used for receiving the first voltage level, and the second source/drain of the fourth transistor is coupled to the second source/drain of the third transistor and outputs the foregoing clamp voltage.

According to an exemplary embodiment of the present invention, the constant voltage generator includes a fifth transistor (NMOS transistor). The gate of the fifth transistor is used for receiving the foregoing clamp voltage, and the first source/drain of the fifth transistor is coupled to the gate of the fourth transistor and outputs the foregoing constant voltage to the drain side of each memory cell. Wherein, the second source/drain of the fifth transistor provides the current of each memory cell to a sensing and amplifying unit which is used for detecting the data of each memory cell.

According to an exemplary embodiment of the present invention, each of the foregoing memory cells is a multilevel memory cell, and the foregoing memory may be a flash memory, a DRAM, or an SRAM.

According to the present invention, the low offset clamp bias circuit can be applied to any existing memory, and this is because a constant voltage generator and a clamp bias modulator are added to the low offset clamp bias circuit to form a feedback mechanism for compensating the drain side voltage $V_d$ of each memory cell in the memory cell array area, so as to reduce the variation of the drain side voltage $V_d$ of each memory cell in the memory cell array area. Thus, the read margin of the memory cell can be increased and accordingly the data in the memory cell can be read more accurately.

Besides, the constant voltage generator and the clamp bias modulator added to the low offset clamp bias circuit in the present invention are composed of a few transistors to replace the amplifier used conventionally, thus, the number of transistors used can be reduced, so as to reduce the power consumption, and the surface area taken by the memory at chip design is smaller. Accordingly, the fabricating cost can be reduced.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a diagram of a conventional clamp bias circuit applied to the drain side voltage $V_d$ of a memory cell.

FIG. 2 is a table illustrating the differences of the drain side voltage $V_d$ of the memory cell in FIG. 1 when it produces different memory cell currents $I_{cell}$.

FIG. 3 is a diagram illustrating a conventional clamp bias circuit for reducing the variation of the drain voltage side $V_d$ of a memory cell.

DESCRIPTION OF EMBODIMENTS

The low offset clamp bias circuit in the present invention is suitable for a memory such as flash memory, dynamic random access memory (DRAM), or static random access memory (SRAM). Wherein, the memory has a plurality of memory cell array areas, and each memory cell array area has a plurality of memory cells, which are multilevel memory cells. For the convenience of description, a memory with a single memory cell array area is used as an example for explaining the theory of the present invention, however, the present invention is not limited hereto, and the theory of a memory having multiple memory cell array areas should be understood easily by those having ordinary skill in the art.

Figure 4:
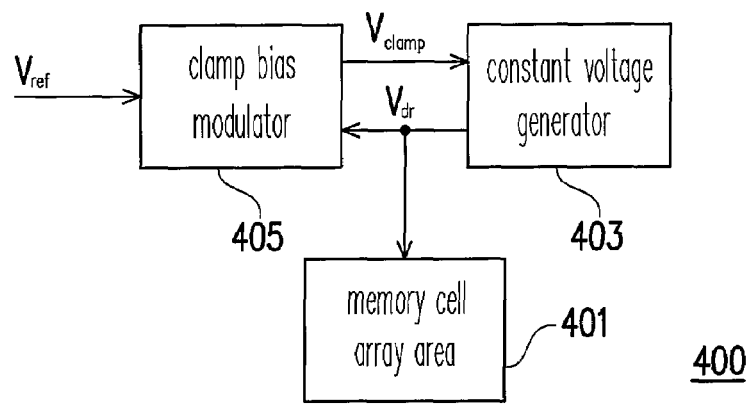
FIG. 4 is a block diagram of a low offset clamp bias circuit according to an exemplary embodiment of the present invention.

FIG. 4 is a block diagram of a low offset clamp bias circuit according to an exemplary embodiment of the present invention. Referring to FIG. 4, the low offset clamp bias circuit 400 includes a memory cell array area 401, a constant voltage generator 403, and a clamp bias modulator 405. Wherein, the memory cell array area 401 is similar to the memory cell array area 101 described in FIG. 1, therefore, the details will not be described herein. The constant voltage generator 403 is coupled to each memory cell (not shown) in the memory cell array area 401 for outputting a constant voltage $V_{dr}$ according to the current $I_{cell}$ of each memory cell. The clamp bias modulator 405 is coupled to the constant voltage generator 403 for receiving a reference voltage $V_{ref}$, then comparing the reference voltage $V_{ref}$ with the constant voltage $V_{dr}$ output by the constant voltage generator 403, and outputting a clamp voltage $V_{clamp}$ to the constant voltage generator 403 according to the comparison result.

Figure 5:
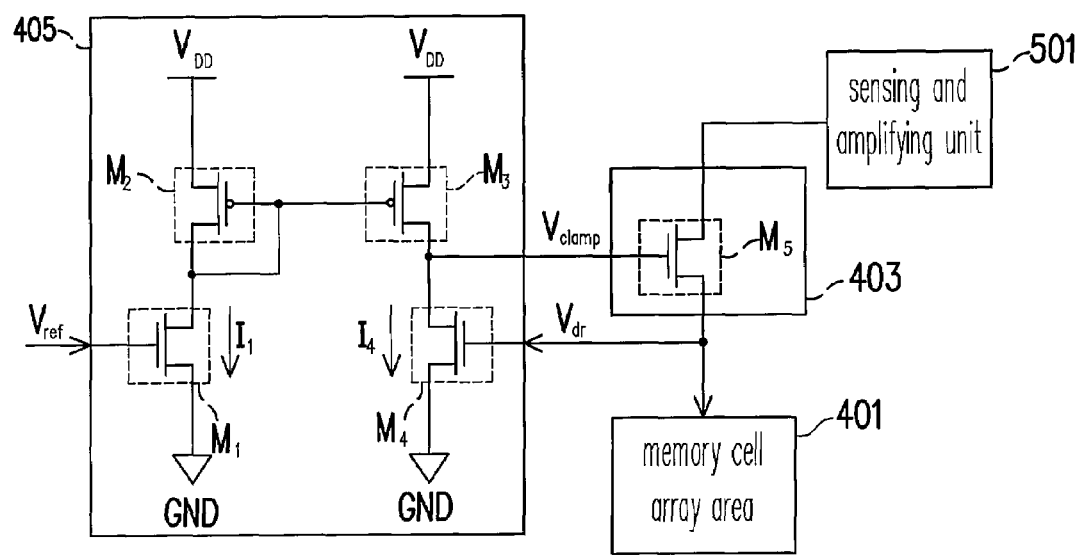
FIG. 5 is a circuit diagram of the low offset clamp bias circuit in the present embodiment.

FIG. 5 is a circuit diagram of the low offset clamp bias circuit 400 in the present embodiment. Referring to both FIG. 4 and FIG. 5, the clamp bias modulator 405 includes a first transistor $M_1$, a second transistor $M_2$, a third transistor $M_3$, and a fourth transistor $M_4$. In the present embodiment, the transistors $M_1$ and $M_4$ may be NMOS transistors, and the transistors $M_2$ and $M_3$ may be PMOS transistors. Wherein, the sources of the transistors $M_1$ and $M_4$ are used for receiving a first voltage level, for example, the ground voltage level GND, however, the present invention is not limited hereto as long as the first voltage level is a constant voltage level. The gate of the transistor $M_1$ is used for receiving a reference voltage $V_{ref}$, and the drain of the transistor $M_1$ is coupled to the drain, gate of the transistor $M_2$ and the gate of the transistor $M_3$. The sources of the transistors $M_2$ and $M_3$ are used for receiving a second voltage level, for example, the system voltage $V_{DD}$, and the drain of the transistor $M_3$ is coupled to the drain of the transistor $M_4$ and outputs the clamp voltage $V_{clamp}$.

The constant voltage generator 403 includes a fifth transistor $M_5$. The gate of the transistor $M_5$ is coupled to the drain of the transistor $M_3$, and the source thereof is used for outputting a constant voltage $V_{dr}$ to the gate of the transistor $M_4$. Wherein, the constant voltage $V_{dr}$ output by the source of the transistor $M_5$ is produced according to the memory cell current $I_{cell}$ in the memory cell array area 401, that is, according to the conventional technology, resistive loading effect may be produced due to the inherent architecture of the memory, thus, when the memory cell current $I_{cell}$ in the memory cell array area 401 increases, the constant voltage $V_{dr}$ output by the source of the transistor $M_5$ decreases; contrarily, when the memory cell current $I_{cell}$ in the memory cell array area 401 decreases, the constant voltage $V_{dr}$ output by the source of the transistor $M_5$ increases. It should be mentioned that the drain of the transistor $M_5$ is coupled to a sensing and amplifying unit 501, which is used for detecting the data in each memory cell in the memory cell array area 401.

Referring to FIG. 5 again, the transistors $M_2$ and $M_3$ form a current mirror, and it can be understood according to the theory of current mirror that the currents $I_1$ and $I_4$ passing through the transistors $M_1$ and $M_4$ are the same. As described above, when the constant voltage $V_{dr}$ output by constant voltage generator 403 according to the memory cell current $I_{cell}$ in the memory cell array area 401 increases and is higher than the reference voltage $V_{ref}$ received by the clamp bias modulator 405, the clamp voltage $V_{clamp}$ output by the clamp bias modulator 405 decreases due to the feedback mechanism formed by the constant voltage generator 403 and the clamp bias modulator 405, so that the constant voltage $V_{dr}$ output by the constant voltage generator 403 decreases to the reference voltage $V_{ref}$ received by the clamp bias modulator 405, that is, the constant voltage $V_{dr}$ is equal to the reference voltage $V_{ref}$.

Contrarily, when the constant voltage $V_{dr}$ output by the constant voltage generator 403 decreases and is lower than the reference voltage $V_{ref}$ received by the clamp bias modulator 405, similarly, the clamp voltage $V_{clamp}$ output by the constant voltage generator 403 increases due to the feedback mechanism formed by the constant voltage generator 403 and the clamp bias modulator 405, so that the constant voltage $V_{dr}$ output by the constant voltage generator 403 increases to the reference voltage $V_{ref}$ received by the clamp bias modulator 405, that is, the constant voltage $V_{dr}$ is equal to the reference voltage $V_{ref}$.

Figures 6, 7:
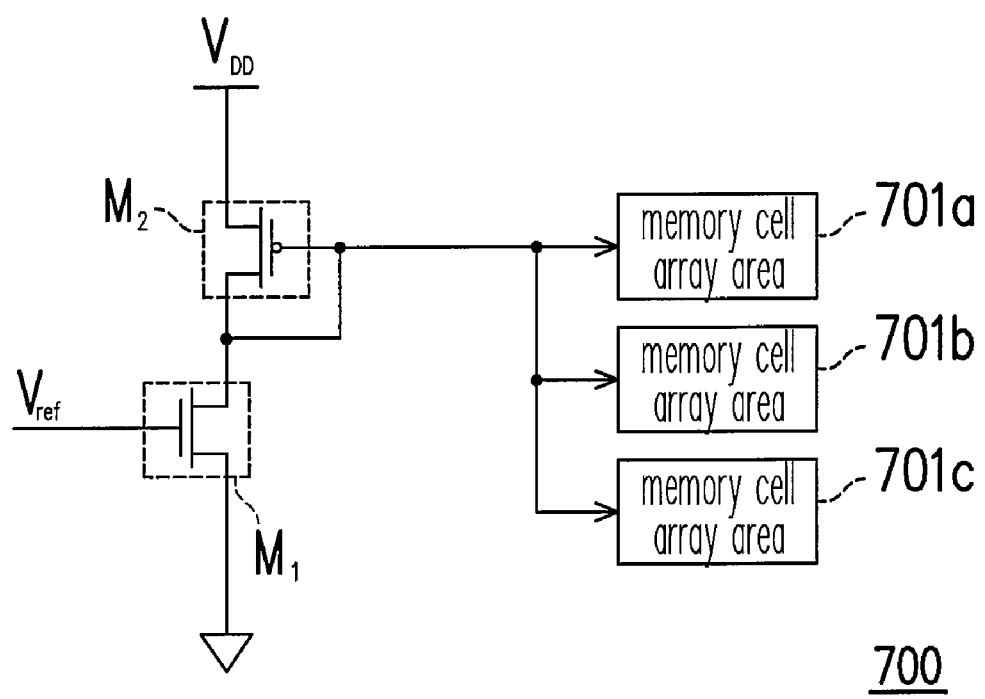
FIG. 6 is a table illustrating the differences of the drain side voltage $V_d$ of the memory cell in a memory cell array area when the memory cell produces different memory cell currents $I_{cell}$ after adopting the low offset clamp bias circuit in the present embodiment is adopted.
FIG. 7 illustrates a memory adopting a low offset clamp bias circuit according to an exemplary embodiment of the present invention.

FIG. 6 is a table illustrating the differences of the drain side voltage $V_d$ of the memory cell in the memory cell array area 401 when the memory cell 401 produces different memory cell currents $I_{cell}$ after the low offset clamp bias circuit 400 in the present embodiment is adopted. Referring to both FIG. 4 and FIG. 6, the table as shown in FIG. 6 illustrates that when a memory cell in the memory cell array area 401 produces different memory cell currents $I_{cell}$ for example, 5 uA or 25 uA, and the resistive loading effect in conventional technology is considered, the variations of the drain side voltage $V_d$ of the memory cell in the memory cell array area 401.

It can be understood from the table in FIG. 6 that when the memory cell current $I_{cell}$ produced by the memory cell in the memory cell array area 401 is 5 uA and 25 uA, the clamp voltage $V_{clamp}$ received by the gate of the transistor $M_5$ of the constant voltage generator 403 is respectively 2.35V and 2.46V, while the constant voltage $V_{dr}$ provided correspondingly by the source of the transistor $M_5$ of the constant voltage generator 403 is respectively 1.658V and 1.639V, thus, the variation is 0.019V (19 mV). Next, when the resistive loading effect is brought into consideration, the drain side voltage $V_d$ of the memory cell in the memory cell array area 401 is respectively 1.629V and 1.493V, thus, the variation is 0.136V (136 mV). Compared to the table of the conventional technology in FIG. 2, when the low offset clamp bias circuit 400 in the present embodiment is applied to a memory, the variation of the drain side voltage $V_d$ supplied to the memory cell in the memory cell array area 401 is reduced to half of that in the conventional technology, that is, it is 234 mV in the conventional technology while 136 mV in the present embodiment.

According to the spirit of the present invention, in the low offset clamp bias circuit 400, the variation of the drain side voltage $V_d$ supplied to the memory cell in the memory cell array area 401 is reduced according to the changes of the memory cell current $I_{cell}$ in the memory cell array area 401, so that the read margin of the memory is increased, accordingly, the memory cell current $I_{cell}$ is further ensured to fall outside of the read margin when reading data in the memory cell, thus the data in the memory cell can be read more accurately. It should be mentioned that the low offset clamp bias circuit 400 in the present invention is not limited to reading data in a memory cell, that is, it can be applied to writing or erasing data in a memory cell to write or erase data more accurately.

FIG. 7 illustrates the memory 700 after adopting the low offset clamp bias circuit 400 according to an exemplary embodiment of the present invention. Referring to both FIG. 5 and FIG. 7, the memory 700 includes transistors $M_1$, $M_2$ and memory cell array areas 701a~701c, however, the number of the memory cell array areas is not limited in the present invention. Wherein, one of the memory cell array areas 701a~701c includes transistors $M_3$, $M_4$, $M_5$, a sensing and amplifying unit 501, and a memory cell array area 401. The couplings and circuit theories of the transistors $M_1$, $M_2$ and the memory cell array areas 701a~701c are the same as those of the low offset clamp bias circuit 400 in the foregoing embodiments, therefore, the details will not be described herein.

It should be mentioned that only a transistor $M_1$ and a transistor $M_2$ are used to work along with the foregoing memory cell array areas 701a~701c in the memory 700 in FIG. 7, thus, the power consumption of the memory 700 is reduced, and moreover, the surface area of the memory 700 at chip design is also decreased, accordingly, the fabricating cost is lowered.

In overview, the present invention provides a memory and a low offset clamp bias circuit thereof. The present invention has the following advantages:

1. the variation of the drain side voltage $V_d$ supplied to the memory cell in the memory cell array area is reduced due to the feedback mechanism formed by the constant voltage generator and the clamp bias modulator.
2. the accuracy in reading, writing, or erasing memory data is improved through reducing the variation of the drain side voltage $V_d$ of the memory cell in the memory cell array area.
3. since the number of transistors used by a low offset clamp bias circuit is less, the power consumed by the memory is reduced, and the surface area taken by the memory in a chip design is smaller. Accordingly, the fabricating cost thereof is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low offset clamp bias circuit, adapted for a memory, wherein the memory has a plurality of memory cell array areas, and each of the memory cell array areas has a plurality of memory cells, the low offset clamp bias circuit comprising:
   a constant voltage generator, coupled to one of the memory cell array areas, outputting a constant voltage according to a current of one of the memory cells; and
   a clamp bias modulator, coupled to the constant voltage generator, comparing a reference voltage and the constant voltage, outputting a clamp voltage to the constant voltage generator according to the comparison result,
   wherein when the constant voltage is higher than the reference voltage, the clamp voltage decreases so that the constant voltage is reduced to the reference voltage, and when the constant voltage is lower than the reference voltage, the clamp voltage increases so that the constant voltage is increased to the reference voltage.

2. The low offset clamp bias circuit as claimed in claim 1, wherein the clamp bias modulator comprises:
   a first transistor, having its gate receiving the reference voltage and its first source/drain receiving a first voltage level;
   a second transistor, having its first source/drain receiving a second voltage level and its gate and second source/drain coupled together and to the second source/drain of the first transistor;
   a third transistor, having its first source/drain receiving the second voltage level and its gate coupled to the gate of the second transistor; and
   a fourth transistor, having its first source/drain receiving the first voltage level and its second source/drain coupled to the second source/drain of the third transistor and outputting the clamp voltage.

3. The low offset clamp bias circuit as claimed in claim 2, wherein the first transistor and the fourth transistor are NMOS transistors, and the second transistor and the third transistor are PMOS transistors.

4. The low offset clamp bias circuit as claimed in claim 2, wherein the first voltage level is ground voltage level GND, and the second voltage level is system voltage VDD.

5. The low offset clamp bias circuit as claimed in claim 1, wherein the constant voltage generator comprises a fifth transistor, having its gate receiving the clamp voltage, and its first source/drain coupled to the gate of the fourth transistor and outputs the constant voltage to the drain side of one of the memory cells.

6. The low offset clamp bias circuit as claimed in claim 5, wherein the second source/drain of the fifth transistor provides the current of one of the memory cells to a sensing and amplifying unit which is used for detecting the data in one of the memory cells.

7. The low offset clamp bias circuit as claimed in claim 5, wherein the fifth transistor is an NMOS transistor.

8. The low offset clamp bias circuit as claimed in claim 1, wherein one of the memory cells is a multilevel memory cells.

9. The low offset clamp bias circuit as claimed in claim 1, wherein the memory comprises flash memory, dynamic random access memory, or static random access memory.

10. A memory, comprising:
    a plurality of memory cell array areas, wherein each of the memory cell array areas has a plurality of memory cells; and
    a low offset clamp bias circuit, comprising:
       a constant voltage generator, coupled to one of the memory cell array areas, outputting a constant voltage according to a current of one of the memory cells; and
       a clamp bias modulator, coupled to the constant voltage generator, comparing a reference voltage and the constant voltage and outputting a clamp voltage to the constant voltage generator according to the comparison result,
       wherein when the constant voltage is higher than the reference voltage, the clamp voltage decreases so that the constant voltage is reduced to the reference voltage, and when the constant voltage is lower than the reference voltage, the clamp voltage increases so that the constant voltage is increased to the reference voltage.

11. The memory as claimed in claim 10, wherein the clamp bias modulator comprises:
    a first transistor, having its gate receiving the reference voltage and its first source/drain receiving a first voltage level;
    a second transistor, having its first source/drain receiving a second voltage level and its gate and second source/drain coupled together and to the second source/drain of the first transistor;
    a third transistor, having its first source/drain receiving the second voltage level and its gate coupled to the gate of the second transistor; and
    a fourth transistor, having its first source/drain receiving the first voltage level and its second source/drain coupled to the second source/drain of the third transistor and outputting the clamp voltage.

12. The memory as claimed in claim 11, wherein the first transistor and the fourth transistor are NMOS transistors, and the second transistor and the third transistor are PMOS transistors.

13. The memory as claimed in claim 11, wherein the first voltage level is ground voltage level GND, and the second voltage level is system voltage VDD.

14. The memory as claimed in claim 10, wherein the constant voltage generator comprises a fifth transistor, having its gate receiving the clamp voltage, and its first source/drain coupled to the gate of the fourth transistor and outputs the constant voltage to the drain side of one of the memory cells.

15. The memory as claimed in claim 14, wherein the second source/drain of the fifth transistor provides the current of one of the memory cells to a sensing and amplifying unit which is used for detecting the data in one of the memory cells.

16. The memory as claimed in claim 14, wherein the fifth transistor is an NMOS transistor.

17. The memory as claimed in claim 10, wherein one of the memory cells is a multilevel memory cells.

18. The memory as claimed in claim 10, wherein the memory comprises flash memory, dynamic random access memory, or static random access memory.

* * * * *